United States Patent
Mochizuki

(10) Patent No.: US 9,081,267 B2
(45) Date of Patent: Jul. 14, 2015

(54) LIGHT EMITTING DEVICE AND PROJECTOR

(71) Applicant: Seiko Epson Corporation, Tokyo (JP)

(72) Inventor: Masamitsu Mochizuki, Fujimi (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/477,267

(22) Filed: Sep. 4, 2014

(65) Prior Publication Data

US 2014/0375960 A1  Dec. 25, 2014

Related U.S. Application Data

(63) Continuation of application No. 13/369,696, filed on Feb. 9, 2012, now Pat. No. 8,894,211.

(30) Foreign Application Priority Data

Mar. 9, 2011  (JP) .................................. 2011-051569

(51) Int. Cl.
| | |
|---|---|
| *G03B 21/26* | (2006.01) |
| *G03B 21/20* | (2006.01) |
| *G02B 6/122* | (2006.01) |
| *H01L 33/00* | (2010.01) |
| *H01L 33/08* | (2010.01) |
| *G03B 21/00* | (2006.01) |
| *H01L 33/24* | (2010.01) |
| *H01L 33/60* | (2010.01) |
| *G02B 6/12* | (2006.01) |

(52) U.S. Cl.
CPC ............ *G03B 21/2033* (2013.01); *G02B 6/122* (2013.01); *G03B 21/006* (2013.01); *G03B 21/2066* (2013.01); *H01L 33/0045* (2013.01); *H01L 33/08* (2013.01); *H01L 33/24* (2013.01); *H01L 33/60* (2013.01); *G02B 2006/121* (2013.01)

(58) Field of Classification Search
CPC ............................ H01L 33/0045; H01L 33/08
USPC ............................................................ 353/30
See application file for complete search history.

(56) References Cited

U.S. PATENT DOCUMENTS

| | | | |
|---|---|---|---|
| 4,852,960 | A | 8/1989 | Alferness et al. |
| 6,356,382 | B1 | 3/2002 | Nakano et al. |
| 7,265,898 | B2 | 9/2007 | Wang et al. |

(Continued)

FOREIGN PATENT DOCUMENTS

| | | |
|---|---|---|
| JP | 2007-165689 A | 6/2007 |
| JP | 2009-238843 A | 10/2009 |

(Continued)

*Primary Examiner* — Toan Ton
*Assistant Examiner* — Danell L Owens
(74) *Attorney, Agent, or Firm* — Harness, Dickey & Pierce, P.L.C.

(57) ABSTRACT

A light emitting device includes a first layer that generates light by injection of a current and forms a waveguide of the light, and an electrode that injects the current into the first layer, wherein the waveguide of the light has a belt-like first region and a belt-like second region, the first region has a first part with curvature, the second region has a second part with curvature, the first region and the second region are connected in a reflection part provided on a side surface of the first layer, and a first light output from the first region on a side surface of the first layer as an output surface opposed to the side surface on which the reflection part is provided and a second light output from the second region on the output surface are output in the same direction.

20 Claims, 8 Drawing Sheets

(56) References Cited

U.S. PATENT DOCUMENTS

| | | |
|---|---|---|
| 7,627,216 B2 | 12/2009 | Lealman et al. |
| 2008/0101747 A1 | 5/2008 | Nakagawa |
| 2010/0155759 A1 | 6/2010 | Nagawa |

FOREIGN PATENT DOCUMENTS

| | | |
|---|---|---|
| JP | 2010-003833 A | 1/2010 |
| JP | 2010-147321 A | 7/2010 |
| JP | 2010-192603 A | 9/2010 |
| JP | 2012-142504 A | 7/2012 | ized. Another advantage
LIGHT EMITTING DEVICE AND PROJECTOR

CROSS-REFERENCE TO RELATED APPLICATIONS

This is a continuation patent application of U.S. application Ser. No. 13/369,696 filed Feb. 9, 2012 which claims priority to Japanese Patent Application No. 2011-051569, filed Mar. 9, 2011, all of which are expressly incorporated by reference herein in their entireties.

BACKGROUND

1. Technical Field

The present invention relates to a light emitting device and a projector.

2. Related Art

A super luminescent diode (hereinafter, referred to as "SLD") is a semiconductor light emitting device that can output several hundreds of milliwatts like a semiconductor laser, while exhibiting a broadband spectrum and thus being incoherent like a typical light emitting diode.

The SLD can be used as a light source of a projector, for example. In order to realize a light source having high power and small etendue, it is desirable that lights output from plural gain regions travel in the same direction. In Patent Document 1 (JP-A-2010-192603), by combining a gain region having a linear shape and a gain region having an arc shape, lights output from light emitting area of the two gain regions are allowed to travel in the same direction.

To reduce loss of an optical system and reduce the number of optical component, a type of a projector that can perform light collimation and uniform illumination simultaneously by providing an SLD immediately below a light valve and using a lens array, has been proposed. In the projector of that type, it is necessary to provide light emitting area according to the lens array.

In the SLD described in Patent Document 1, it is difficult to arrange plural light emitting area at large distances according to the lens array, and the SLD is not applicable to the projector of the above described type.

SUMMARY

An advantage of some aspects of the invention is to provide a light emitting device that may be applied to a type of a projector in which distances between plural light emitting areas should be made larger and a light emitting device is provided immediately below a light valve. Another advantage of some aspects of the invention is to provide a projector having the light emitting device.

A light emitting device according to an aspect of the invention includes a first layer that generates light by injection current and forms a waveguide of the light, a second layer and a third layer that sandwich the first layer and suppress leakage of the light, and an electrode that injects the current into the first layer, wherein the waveguide of the light obtained by the electrode has a belt-like first region and a belt-like second region, the first region has a first part with curvature, the second region has a second part with curvature, the first region and the second region are connected in a reflection part provided on a side surface of the first layer, and a first light is output from the first region on an output surface which is a side surface of the first layer opposed to the side surface on which the reflection part is provided, a second light is output from the second region on the output surface, and the first and second light are output in the same direction.

According to the light emitting device, a distance between a light output part of a first gain region and a light output part of a second gain region may be made larger without increasing incident angles to a second surface of lights generated in the first gain region and the second gain region. Thereby, distortion of a radiation pattern of output light may be suppressed, and, for example, in the case where the light emitting device is used for a light source of a projector, a light valve may be uniformly illuminated.

Further, according to the light emitting device, compared to the example of using a linear gain region from the first surface to the second surface, distances between the light output parts may be made larger without increase in the entire length of the gain region. Accordingly, lots of current is not necessary to flow and power consumption may be suppressed. Moreover, it is not necessary to make the entire length of the gain region larger, downsizing of the entire device may be realized. Thereby, resources are not wasted and the manufacturing cost may be suppressed.

As described above, in the light emitting device, the radiation pattern may be made better, downsizing may be realized, and the distances between the plural light output parts may be made larger.

In the light emitting device according to the aspect of the invention, the reflection part may have reflectance higher than reflectance on the output surface in a wavelength range of the light generated in the first layer.

According to the light emitting device, the distances between the plural light output parts may be made larger.

In the light emitting device according to the aspect of the invention, the first region may be connected to the reflection part and tilted in a first direction with respect to a perpendicular of the side surface on which the reflection part is provided as seen from a stacking direction of the first layer, and the second layer, and the second region may be connected to the reflection part and tilted in a second direction with respect to the perpendicular of the side surface on which the reflection part is provided as seen from the stacking direction of the first layer, and the second layer.

According to the light emitting device, the distances between the plural light output parts may be made larger.

In the light emitting device according to the aspect of the invention, the first region may be tilted at a first angle with respect to the perpendicular and connected to the reflection part, the second region may be tilted at a second angle with respect to the perpendicular and connected to the reflection part, and the first angle and the second angle may be equal to or more than a critical angle and may be the same.

According to the light emitting device, the reflection part may totally reflect the lights generated in the first region and the second region. Therefore, light loss in the reflection part may be suppressed and lights may be efficiently reflected.

In the light emitting device according to the aspect of the invention, the first region and the second region may be connected to the output surface in the same direction as seen from the stacking direction of the first layer, and the second layer.

According to the light emitting device, the distances between the plural light output parts may be made larger.

In the light emitting device according to the aspect of the invention, the first region and the second region may be connected to the output surface and tilted with respect to the perpendicular of the output surface andas seen from the stacking direction of the first layer, and the second layer.

According to the light emitting device, it may be possible to prevent multiple reflection of the lights generated in the first region and the second region. As a result, it may be possible to prevent formation of a direct resonator, and laser oscillation of the lights generated in the first region and the second region may be suppressed.

In the light emitting device according to the aspect of the invention, the first region and the second region may be connected to the output surface and are in parallel to the perpendicular of the output surface as seen from the stacking direction of the first layer, and the second layer.

According to the light emitting device, design of the downstream optical system may be made easier.

In the light emitting device according to the aspect of the invention, the first region may have a third part linearly provided from the first part to the output surface, and the second region may have a fourth part linearly provided from the second part to the output surface.

According to the light emitting device, the distances between the plural light output parts may be made larger.

In the light emitting device according to the aspect of the invention, the first region may have a fifth part linearly provided from the reflection part to the first part, and the second region may have a sixth part linearly provided from the reflection part to the second part.

According to the light emitting device, the light generated in the first gain region and reflected in the reflection part may be allowed to enter the second gain region more reliably, and the light generated in the second gain region and reflected in the reflection part may be allowed to enter the first gain region more reliably.

In the light emitting device according to the aspect of the invention, the first part may be connected to the reflection part and the output surface, and the second part may be connected to the reflection part and the output surface.

According to the light emitting device, there is no linear part, and thus, downsizing may be realized by the amount.

In the light emitting device according to the aspect of the invention, the first part and the second part may have arc shapes as seen from the stacking direction of the first layer, and the second layer.

According to the light emitting device, the distances between the plural light output parts may be reliably made larger.

In the light emitting device according to the aspect of the invention, the side surface on which the reflection part is provided may be a cleavage surface.

According to the light emitting device, the reflection part may be formed with higher accuracy compared to the case where it is formed using a photolithography technology and an etching technology, for example, and light diffusion in the reflection part may be made smaller. Therefore, light loss in the reflection part may be suppressed and lights may be efficiently reflected.

A light emitting device according to another aspect of the invention includes a multilayered structure having a first layer, and a second layer and a third layer that sandwich the first layer, the first layer has a first gain region and a second gain region that generate and guide lights, the second layer and the third layer are layers that suppress leakage of the lights generated in the first gain region and the second gain region, the first layer has a first surface and a second surface forming an outer shape of the multilayered structure and opposed to each other, in a wavelength range of the lights generated in the first gain region and the second gain region, reflectance of the first surface is higher than reflectance of the second surface, the first gain region and the second gain region are provided from the first surface to the second surface, the first gain region is connected to the first surface and tilted in a first direction with respect to a perpendicular of the first surface as seen from a stacking direction of the multilayered structure, the second gain region is connected to the first surface and tilted in a second direction with respect to the perpendicular as seen from the stacking direction of the multilayered structure, the first gain region and the second gain region are connected to the second surface in the same direction as seen from the stacking direction of the multilayered structure, an end surface at the first surface side of the first gain region and an end surface at the first surface side of the second gain region overlap on the first surface, the first gain region has a first gain part with first curvature as seen from the stacking direction of the multilayered structure, and the second gain region has a second gain part with second curvature as seen from the stacking direction of the multilayered structure.

According to the light emitting device, the radiation pattern may be made better (more symmetric), downsizing may be realized, and the distances between the light output parts may be made larger.

A projector according to still another aspect of the invention includes the light emitting device according to the aspect of the invention, a microlens that integrates light output from the light emitting device, a light modulation device that modulates the light integrated by the microlens in response to image information, and a projection device that projects an image formed by the light modulation device.

According to the projector, alignment of the lens array may be easy and the light modulation device may be irradiated with good uniformity.

BRIEF DESCRIPTION OF THE DRAWINGS

The invention will be described with reference to the accompanying drawings, wherein like numbers reference like elements.

DESCRIPTION OF EXEMPLARY
EMBODIMENTS

As below, a preferred embodiment of the invention will be explained with reference to the drawings.

1. Light Emitting Device

Figure 1:
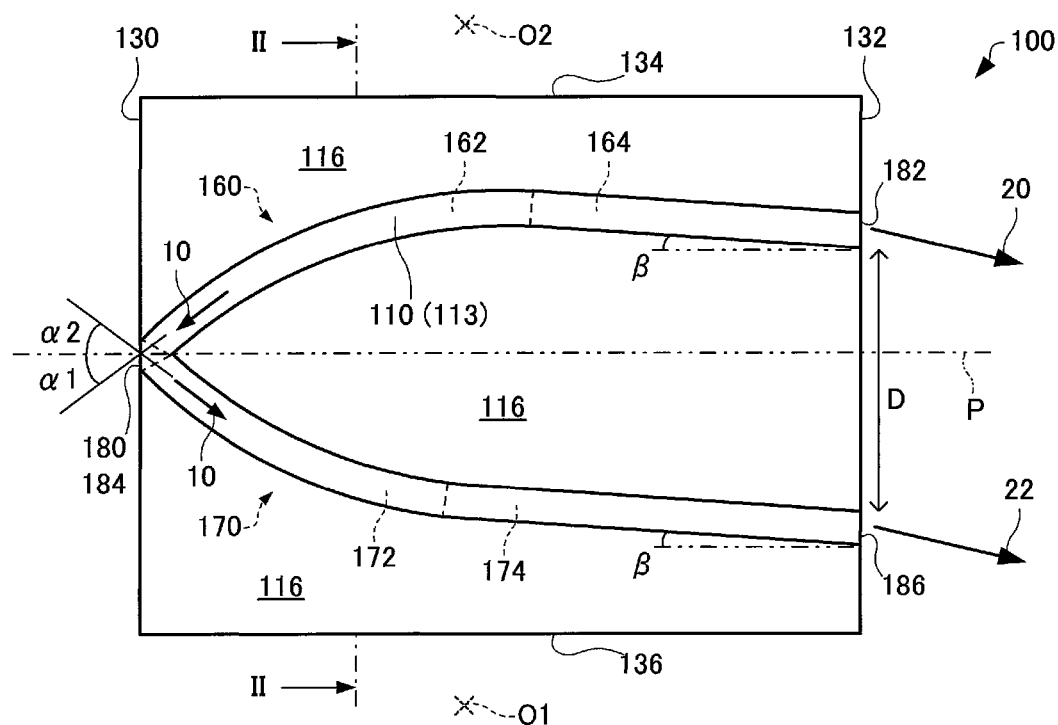
FIG. 1 is a plan view schematically showing a light emitting device according to an embodiment.
Figure 2:
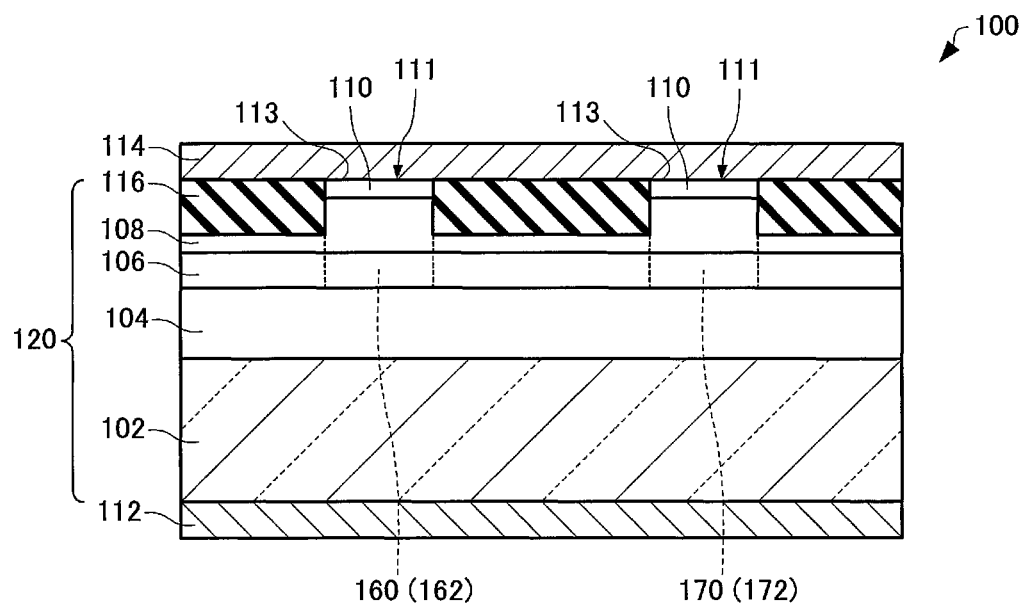
FIG. 2 is a sectional view schematically showing the light emitting device according to the embodiment.

First, a light emitting device according to the embodiment will be explained with reference to the drawings. FIG. 1 is a plan view schematically showing a light emitting device 100 according to the embodiment. FIG. 2 is a sectional view along II-II line of FIG. 1 schematically showing the light emitting device 100 according to the embodiment. Note that, in FIG. 1, for convenience, illustration of a second electrode 114 is omitted.

As below, the case where the light emitting device 100 is an SLD of an InGaAlP system (red) will be explained. Unlike a semiconductor laser, the SLD can prevent laser oscillation by suppressing formation of a resonator due to edge reflection. Accordingly, speckle noise may be reduced.

As shown in FIGS. 1 and 2, the light emitting device 100 may include a multilayered structure 120, a first electrode 112, and the second electrode 114.

The multilayered structure 120 may have a substrate 102, a second layer 104 (also referred to as "first cladding layer 104"), a first layer 106 (also referred to as "active layer 106"), a third layer 108 (also referred to as "second cladding layer 108"), a fourth layer 110 (also referred to as "contact layer 110"), and an insulating layer 116. The shape of the multilayered structure 120 is a rectangular parallelepiped (including the case of a cube) or the like.

As the substrate 102, for example, a first conductivity-type (for example, n-type) GaAs substrate or the like may be used.

The first cladding layer 104 is formed on the substrate 102. As the first cladding layer 104, for example, an n-type InGaAlP layer or the like may be used. Note that, though not illustrated, a buffer layer may be formed between the substrate 102 and the first cladding layer 104. As the buffer layer, for example, an n-type GaAs layer, AlGaAs layer, InGaP layer, or the like may be used. The buffer layer may improve crystallinity of a layer formed thereon.

The active layer 106 is formed on the first cladding layer 104. The active layer 106 is sandwiched between the first cladding layer 104 and the second cladding layer 108. The active layer 106 has a multiple quantum well (MQW) structure in which three quantum well structures each including an InGaP well layer and an InGaAlP barrier layer, for example, are stacked.

The shape of the active layer 106 is a rectangular parallelepiped (including the case of a cube) or the like. The planar shape of the active layer 106 is the same as the planar shape of the multilayered structure 120, for example. The active layer 106 may have a first surface 130, a second surface 132, a third surface 134, and a fourth surface 136 as shown in FIG. 1. The surfaces 130, 132, 134, 136 are surfaces of the active layer 106, do not have in plane contact with the first cladding layer 104 or the second cladding layer 108, and form an outer shape of the multilayered structure 120. The surfaces 130, 132, 134, 136 are flat surfaces provided on the side surfaces (side walls) of the active layer 106 as seen from the stacking direction of the multilayered structure 120, in other words, parts of the side surface of the multilayered structure 120. The first surface 130 and the second surface 132 are opposed to each other and in parallel in the illustrated example. The third surface 134 and the fourth surface 136 are surfaces connected to the first surface 130 and the second surface 132, and opposed to each other and in parallel in the illustrated example.

The first surface 130 may be a cleavage surface formed by cleavage. The method of forming the second surface 132 is not limited as long as it is opposed to the first surface 130. For example, using a cleavage surface as the first and second surface 130, 132, the second surface may be easily opposed to the first surface 130 in parallel.

Parts of the active layer 106 form a first gain region 160 and a second gain region 170. The gain regions 160, 170 may generate lights and the lights may be amplified while propagating through the gain regions 160, 170. That is, the gain regions 160, 170 also serve as waveguides for the lights generated in the active layer 106.

The gain regions 160, 170 are provided from the first surface 130 to the second surface 132 as shown in FIG. 1, and have belt-like shapes with predetermined widths in a plan view from the stacking direction of the multilayered structure 120. Further, the respective belt-like regions of the gain regions 160, 170 are connected at the first surface 130 side. The first gain region 160 has a first end surface 180 provided on the first surface 130 and a second end surface 182 provided on the second surface 132. The second gain region 170 has a third end surface 184 provided on the first surface 130 and a fourth end surface 186 provided on the second surface 132.

The first end surface 180 of the first gain region 160 and the third end surface 184 of the second gain region 170 overlap on the first surface 130. In the illustrated example, the first end surface 180 and the third end surface 184 completely overlap. On the other hand, the second end surface 182 of the first gain region 160 and the fourth end surface 186 of the second gain region 170 are separated at a distance D on the second surface 132.

The first gain region 160 is connected to the first surface 130 and tilted toward one side (for example, the third surface 134 side) with respect to a perpendicular P of the first surface 130 (also referred to as "a perpendicular P of the second surface 132" when the surfaces 130, 132 are in parallel) as seen from the stacking direction of the multilayered structure 120 (in the plan view) as shown in FIG. 1. In other words, the longitudinal direction of the belt-like shape of the first gain region 160 has an angle with respect to the perpendicular P. More specifically, the first gain region 160 is connected to the first surface 130 and tilted at a first angle $\alpha 1$ with respect to the perpendicular P. The longitudinal direction of the first gain region 160 is an extension direction of the first gain region 160 near the first surface 130, and, for example, may be set to a tangential direction with respect to a boundary line of the first gain region 160 (and the part except the first gain region 160) at intersection between the boundary line and the first surface 130. The second gain region 170 is also connected to the first surface 130 and tilted toward the other side (for example, the fourth surface 136 side) with respect to the perpendicular P in the plan view. In other words, the longitudinal direction of the belt-like shape of the second gain region 170 has an angle with respect to the perpendicular P. More specifically, the second gain region 170 is connected to the first surface 130 and tilted at a second angle $\alpha 2$ with respect to the perpendicular P. The longitudinal direction of the second gain region 170 is an extension direction of the second gain region 170 near the first surface 130, and, for example, may be set to a tangential direction with respect to a boundary line of the second gain region 170 (and the part except the second gain region 170) at intersection between the boundary line and the first surface 130.

Note that the first angle α1 is also referred to as an incident angle of the light generated in the first gain region 160 with respect to the first surface 130, and the second angle α2 is also referred to as an incident angle of the light generated in the second gain region 170 with respect to the first surface 130.

In the illustrated example, the first angle α1 and the second angle α2 are the same acute angle, and equal to or more than a critical angle. Thereby, the first surface 130 may totally reflect the lights generated in the gain regions 160, 170.

The first gain region 160 and the second gain region 170 are connected to the second surface 132 with their longitudinal directions of respective belt-like shapes tilted at the same tilt (in the same direction) with respect to the perpendicular P of the second surface 132. More specifically, the gain regions 160, 170 are tilted at a third angle β with respect to the perpendicular P and connected to the second surface 132. The longitudinal directions of the gain regions 160, 170 are extension directions of the gain regions 160, 170 near the second surface 132. For example, they may be set to the tangential directions with respect to boundary lines of the gain regions 160, 170 (and the parts except the gain regions 160, 170) at intersections between the boundary lines and the second surface 132. The third angle β may be any angle as long as it is less than the critical angle and so it may be 0°. Thereby, a light 20 output from the second end surface 182 of the first gain region 160 and a light 22 output from the fourth end surface 186 of the second gain region 170 may travel in the same direction. The second end surface 182, and the fourth end surface 186 are also referred to as light output parts (emitting areas).

Note that the third angle β is also referred to as an incident angle of the lights generated in the gain regions 160, 170 with respect to the second surface 132.

As described above, by setting the angles α1, α2 equal to or more than the critical angle and the angle β less than the critical angle, reflectance of the first surface 130 may be made higher than reflectance of the second surface 132 in the wavelength band of the lights generated in the gain regions 160, 170. That is, the first surface 130 may serve as a reflection surface and the second surface 132 may serve as a light output surface. That is, the first end surface 180 and the third end surface 184 provided on the first surface 130 as the reflection surface may serve as reflection parts reflection areas) that reflect the lights generated in the gain regions 160, 170. The second end surface 182 and the fourth end surface 186 provided on the second surface 132 as the light output surface may serve as light output parts (emitting areas) that output lights generated in the gain regions 160, 170.

Note that, though not illustrated, for example, the first surface 130 may be covered by a reflection film and the second surface 132 may be covered by an antireflection film. Thereby, in the wavelength band of the lights generated in the gain regions 160, 170, the reflectance of the first surface 130 may be made higher than the reflectance of the second surface 132. As the reflection film and the antireflection film, $SiO_2$ layers, $Ta_2O_5$ layers, $Al_2O_3$ layers, TiN layers, $TiO_2$ layers, SiON layers, SiN layers, multilayer films of them, or the like may be used.

Furthermore, the third angle β may be set to an angle larger than 0°. Thereby, it may be possible to prevent multiple reflections of the lights generated in the gain regions 160, 170 between the second end surface 184 and the fourth end surface 186. As a result, it may be possible to prevent formation of a direct resonator, and laser oscillation of the lights generated in the gain regions 160, 170 may be suppressed.

The first gain region 160 has a first gain part 162. Similarly, the second gain region 170 has a second gain part 172.

The first gain part 162 and the second gain part 172 are connected to the first surface 130, for example. That is, the first gain part 162 forms the first end surface 180 of the first gain region 160 in the connection part to the first surface 130, and the second gain part 172 forms the third end surface 184 of the second gain region 170 in the connection part to the first surface 130.

The first gain part 162 has a belt-like shape with a predetermined width (a shape having a longitudinal side and a shorter side) and first curvature along an in-plane direction in the plan view as shown in FIG. 1. The second gain part 172 has a belt-like shape with a predetermined width and second curvature along an in-plane direction in the plan view. The first curvature and the second curvature may take the same value or different values. In the illustrated example, the first gain part 162 and the second gain part 172 have arc shapes and the same radius of curvature. The length of the arc of the second gain part 172 may be smaller than the length of the arc of the first gain part 162 as shown in FIG. 1. For example, the first gain part 162 has an arc shape around a point O1, and the second gain part 172 has an arc shape around a point O2. The point O1 is located at the fourth surface 136 side with respect to the perpendicular P passing through the end surfaces 180, 184, and the point O2 is located at the third surface 134 side with respect to the perpendicular P.

The lights generated in the gain regions 160, 170 may travel within the arc-shaped gain parts 162, 172 because of a difference between an effective refractive index of a vertical section of the multilayered structure 120 including the gain parts 162, 172 (hereinafter, simply referred to as "the effective refractive index of the gain parts 162, 172") and an effective refractive index of a vertical section of the multilayered structure 120 except the gain regions 160, 170 (hereinafter, simply referred to as "the effective refractive index of the parts except the gain regions 160, 170").

The radius of curvature of the gain parts 162, 172 depends on the difference between the effective refractive index of the gain parts 162, 172 and the effective refractive index of the parts except the gain regions 160, 170, and is equal to or more than 800 μm, for example. When the radius of curvature of the gain parts 162, 172 is less than 800 μm, it may be impossible to efficiently guide the lights within the gain parts 162, 172. Preferably, the radius of curvature of the gain parts 162, 172 is more than about 1600 μm. Thereby, the lights within the gain parts 162, 172 may be efficiently guided without upsizing the entire light emitting device 100.

The first gain region 160 may further have a third gain part 164. Similarly, the second gain region 170 may further have a fourth gain part 174.

The third gain part 164 is linearly provided from the first gain part 162 to the second surface 132 and has a belt-like shape with a predetermined width. The third gain part 164 forms the second end surface 182 of the first gain region 160 in the connection part to the second surface 132. The third gain part 164 is smoothly connected to the arc-shaped first gain part 162. For example, the third gain part 164 is provided in parallel to a tangential line of the first gain part 162 at a point on a boundary between the gain parts 162, 164. The third gain part 164 is tilted at the third angle β with respect to the perpendicular P.

The fourth gain part 174 is linearly provided from the second gain part 172 to the second surface 132 and has a belt-like shape with a predetermined width. The fourth gain part 174 forms the fourth end surface 186 of the second gain region 170 in the connection part to the second surface 132. The fourth gain part 174 is smoothly connected to the arc-shaped second gain part 172. For example, the gain part 174 is provided in parallel to a tangential line of the second gain part 172 at a point on a boundary between the gain parts 172, 174. The fourth gain part 174 is tilted at the third angle β with respect to the perpendicular P. The third gain part 164 and the fourth gain part 174 are in parallel to each other. The length of the fourth gain part 174 may be larger than the length of the third gain part 164 as shown in FIG. 1.

The second cladding layer 108 is formed on the active layer 106 as shown in FIG. 2. As the second cladding layer 108, a second conductivity-type (for example, p-type) InGaAlP layer or the like may be used.

For example, the p-type second cladding layer 108, the active layer 106 not doped with impurity, and the n-type first cladding layer 104 form a pin diode. Each of the first cladding layer 104 and the second cladding layer 108 is a layer having a larger forbidden band width and a lower refractive index than those of the active layer 106. The active layer 106 has a function of generating light and amplifying and guiding the light. The first cladding layer 104 and the second cladding layer 108 sandwich the active layer 106 and have a function of confining injected carriers (electrons and holes) and light (suppressing leakage of light).

In the light emitting device 100, when a forward bias voltage of the pin diode is applied (a current is injected) between the first electrode 112 and the second electrode 114, the gain regions 160, 170 are produced in the active layer 106 and recombination of electrons and holes occurs in the gain regions 160, 170. Light is generated by the recombination. Starting from the generated light, stimulated emission occurs and the intensity of the light is amplified within the gain regions 160, 170.

For example, as shown in FIG. 1, a light 10 generated in the first gain region 160 and traveling toward the first surface 130 side is amplified within the first gain region 160, and then, reflected on the first surface 130 and output from the fourth end surface 186 of the second gain region 170 as the output light 22. Its light intensity is also amplified within the second gain region 170 after reflection. Similarly, a light generated in the second gain region 170 and traveling toward the first surface 130 side is amplified within the second gain region 170, and then, reflected on the first surface 130 and output from the second end surface 182 of the first gain region 160 as the output light 20. Its light intensity is also amplified within the first gain region 160 after reflection.

Note that the lights generated in the first gain region 160 include a light directly output from the second end surface 182 as the output light 20. Similarly, the lights generated in the second gain region 170 include a light directly output from the fourth end surface 184 as the output light 22. These lights are similarly amplified in the respective gain regions 160, 170.

The contact layer 110 is formed on the second cladding layer 108 as shown in FIG. 2. That is, the contact layer 110 may be formed on the opposite side of the second cladding layer 108 to the active layer 106 side. The contact layer 110 may have ohmic contact with the second electrode 114. The upper surface 113 of the contact layer 110 may be a contact surface between the contact layer 110 and the second electrode 114. As the contact layer 110, for example, a p-type GaAs layer may be used.

The contact layer 110 and part of the second cladding layer 108 may compose a columnar part 111. The planar shape of the columnar part 111 is the same as the planar shapes of the gain regions 160, 170 as seen from the stacking direction of the multilayered structure 120. That is, the planar shape of the upper surface 113 of the contact layer 110 may be the same as the planar shapes of the gain regions 160, 170. For example, current channels between the electrodes 112, 114 are determined by the planar shape of the columnar part 111 and, as a result, the planar shapes of the gain regions 160, 170 are determined. Note that, though not illustrated, the side surface of the columnar part 111 may be inclined.

The insulating layer 116 may be formed at sides of the columnar part 111 on the second cladding layer 108. The insulating layer 116 may be in contact with the side surfaces of the columnar part 111. The upper surface of the insulating layer 116 may be continuous with the upper surface 113 of the contact layer 110, for example. As the insulating layer 116, for example, an SiN layer, an $SiO_2$ layer, an SiON layer, an $Al_2O_3$ layer, a polyimide layer, or the like may be used.

When the above described material is used for the insulating layer 116, the current between the electrodes 112, 114 may flow in the columnar part 111 sandwiched between the insulating layers 116. The insulating layer 116 may have a smaller refractive index than the refractive index of the second cladding layer 108. In this case, the effective refractive index of the vertical section of the part in which the insulating layer 116 is formed is smaller than the effective refractive index of the vertical section of the part in which the insulating layer 116 is not formed, i.e., the part in which the columnar part 111 is formed. Thereby, in the planar direction, the lights may be efficiently confined within the gain regions 160, 170. Note that, though not illustrated, the insulation layer 116 may not be provided. In this case, an air surrounding the columnar part 111 may function as the insulating layer 116.

The first electrode 112 is formed on the entire lower surface of the substrate 102. The first electrode 112 may be in contact with a layer that has ohmic contact with the first electrode 112 (the substrate 102 in the illustrated example). The first electrode 112 is electrically connected to the first cladding layer 104 via the substrate 102. The first electrode 112 is one electrode for driving the light emitting device 100. As the first electrode 112, for example, an electrode formed by stacking a Cr layer, an AuGe layer, an Ni layer, and an Au layer in this order from the substrate 102 side may be used.

Note that a second contact layer (not shown) may be provided between the first cladding layer 104 and the substrate 102, the second contact layer may be exposed to by dry etching or the like from the opposite side to the substrate 102, and the first electrode 112 may be provided on the second contact layer. Thereby, a single-sided electrode structure may be obtained. This formation is especially advantageous when the substrate 102 is insulative.

The second electrode 114 is formed in contact with the upper surface 113 of the contact layer 110. Further, the second electrode 114 may be formed on the insulating layer 116 as shown in FIG. 2. The second electrode 114 is electrically connected to the second cladding layer 108 via the contact layer 110. The second electrode 114 is the other electrode for driving the light emitting device 100. As the second electrode 114, for example, an electrode formed by stacking a Cr layer, an AuZn layer, and an Au layer in this order from the contact layer 110 side may be used.

So far, the case of the InGaAlP system has been explained as an example of the light emitting device 100 according to the embodiment, and any material system that can form a gain region may be used for the light emitting device 100. For example, a semiconductor material of an AlGaN system, a GaN system, an InGaN system, a GaAs system, an AlGaAs system, an InGaAs system, an InP system, an InGaAsP system, a GaInNAs system, a ZnCdSe system, or the like may be used.

Further, in the above described example, the light emitting device 100 of the so-called index-guiding type has been explained. The light emitting device 100 may be of the so-called gain-guiding type. However, given that a predetermined difference is provided between the effective refractive index of the gain parts 162, 172 and the effective refractive index of the parts except the gain regions 160, 170, it is desirable that at least the gain parts 162, 172 having curvature have structures of the index-guiding type.

The light emitting device 100 according to the embodiment may be applied to a light source of a projector, a display, an illumination device, a measurement device, or the like, for example.

The light emitting device 100 according to the embodiment has the following characteristics, for example.

According to the light emitting device 100, the first gain region 160 has the first gain part 162 with the first curvature and the second gain region 170 has the second gain part 172 with the second curvature. Accordingly, the distance D between the second end surface 182 of the first gain region 160 and the fourth end surface 186 of the second gain region 170 (the distance D between the light output parts) may be made larger without increasing the incident angle β of the lights generated in the gain regions 160, 170 to the second surface 132. Thereby, distortion of a radiation pattern of output light may be suppressed, and, for example, in the case where the light emitting device is used as a light source of a projector, a light valve may be uniformly illuminated.

For example, in the formation using gain regions having linear shapes, for making the distances between the light output parts larger, the tilts of the gain regions with respect to the perpendicular of the output surface (the incident angles of the lights generated in the gain regions to the output surface) may become larger and a radiation pattern may be deteriorated. The light emitting device 100 according to the embodiment may avoid the problem.

Further, according to the light emitting device 100, compared to the example of using a linear gain region from the first surface to the second surface, the distance D may be made larger without increase in the entire length of the gain region. Accordingly, lots of current is not necessary to flow and electrical power consumption may be suppressed. Moreover, because it is not necessary to make the entire length of the gain region larger, downsizing of the entire device may be realized. Therefore, resources are not wasted and the manufacturing cost may be suppressed.

For example, when the entire length of the gain region becomes larger, generally, higher power may be realized, however, lots of current is necessary to obtain the so-called population inversion and, as a result, higher efficiency may not be realized unless the device is used with unnecessarily higher light output. That is, with light output less than the predetermined light output, the efficiency is deteriorated. Further, when the entire length of the gain region becomes larger, the area of the entire device becomes larger, and problems of wasted resources, rise of the manufacturing cost, etc. arise. In the light emitting device 100 according to the embodiment, the problems may be avoided.

As described above, in the light emitting device 100, the radiation pattern is good (more symmetric) and the distances D may be made larger while downsizing is realized. More specifically, in the light emitting device 100, the distance D between the light output parts may be set equal to or more than 0.262 mm and equal to or less than 1.909 mm, the angle β may be set equal to or less than 5°, and the entire lengths of the gain regions 160, 170 may be set equal to or more than 1.5 mm and equal to or less than 3 mm.

According to the light emitting device 100, the first gain region 160 may be tilted at the first angle α1 with respect to the perpendicular P and connected to the first surface 130, and the second gain region 170 may be tilted at the second angle α2 with respect to the perpendicular P and connected to the first surface 130. Further, the first angle α1 and the second angle α2 may be the same and equal to or more than the critical angle. Accordingly, the first surface 130 (the end surfaces 180, 184) may totally reflect the lights generated in the gain regions 160, 170. Therefore, in the light emitting device 100, loss of light on the first surface 130 (the end surfaces 180, 184) may be suppressed and the lights may be efficiently reflected. Further, the process of forming the reflection film on the first surface 130 is not necessary, and the manufacturing cost and the materials and resources necessary for manufacturing may be reduced.

According to the light emitting device 100, the first surface 130 may be a cleavage surface formed by cleavage. Accordingly, for example, compared to the case where the surface is formed by a photolithography technology and an etching technology, the first surface 130 may be formed with higher accuracy and scattering of light on the end surfaces 180, 184 may be made smaller. Therefore, in the light emitting device 100, loss of light on the first surface 130 may be suppressed and light may be efficiently reflected.

2. Manufacturing Method of Light Emitting Device

Figure 3:
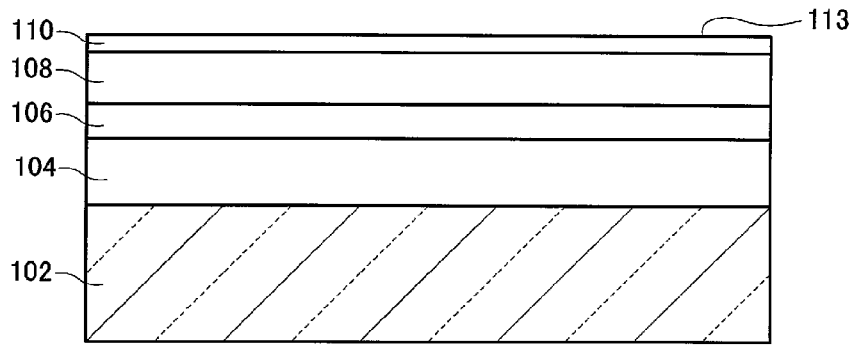
FIG. 3 is a sectional view schematically showing a manufacturing process of the light emitting device according to the embodiment.
Figure 4:
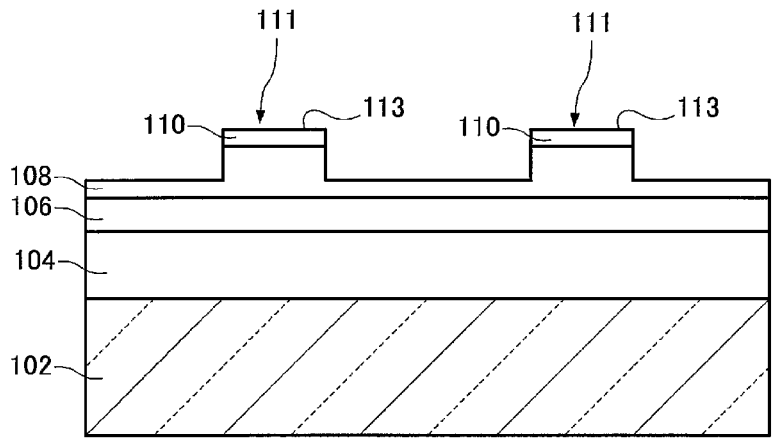
FIG. 4 is a sectional view schematically showing a manufacturing process of the light emitting device according to the embodiment.

Next, a manufacturing method of the light emitting device according to the embodiment will be explained with reference to the drawings. FIGS. 3 and 4 are sectional views schematically showing manufacturing processes of the light emitting device 100 according to the embodiment corresponding to FIG. 2.

As shown in FIG. 3, on the substrate 102, the first cladding layer 104, the active layer 106, the second cladding layer 108, and the contact layer 110 are epitaxially grown in this order. As the growth method, for example, an MOCVD (Metal Organic Chemical Vapor Deposition) method, an MBE (Molecular Beam Epitaxy) method, or the like may be used.

As shown in FIG. 4, the contact layer 110 and the second cladding layer 108 are patterned. The patterning is performed using a photolithography technology and an etching technology, for example. Through the process, the columnar part 111 may be formed.

As shown in FIG. 2, the insulating layer 116 is formed to cover the side surfaces of the columnar part 111. Specifically, first, an insulating member (not shown) is deposited on the second cladding layer 108 (including the contact layer 110) by a CVD (Chemical Vapor Deposition) method, a coating method, or the like, for example. Then, the upper surface 113 of the contact layer 110 is exposed using an etching technology or the like, for example. Through the above described processes, the insulating layer 116 may be formed.

Then, the second electrode 114 is formed on the contact layer 110 and on the insulating layer 116. Then, the first electrode 112 is formed on the lower surface of the substrate 102. The first electrode 112 and the second electrode 114 are formed by vacuum evaporation, for example. Note that the order of formation of the first electrode 112 and the second electrode 114 is not particularly limited.

Through the above described processes, the light emitting device 100 according to the embodiment may be manufactured.

According to the manufacturing method of the light emitting device 100, the light emitting device 100 in which the radiation pattern is good (more symmetric), the distances of the plural light output parts may be made larger while downsizing is realized may be obtained.

3. Modified Examples of Light Emitting Device

Next, light emitting devices according to modified examples of the embodiment will be explained with reference to the drawings. As below, in the light emitting devices according to modified examples of the embodiment, the same signs are assigned to the members having the same functions as those of the light emitting device 100 according to the embodiment, and the detailed explanation will be omitted.

3.1. Light Emitting Device according to First Modified Example

Figure 5:
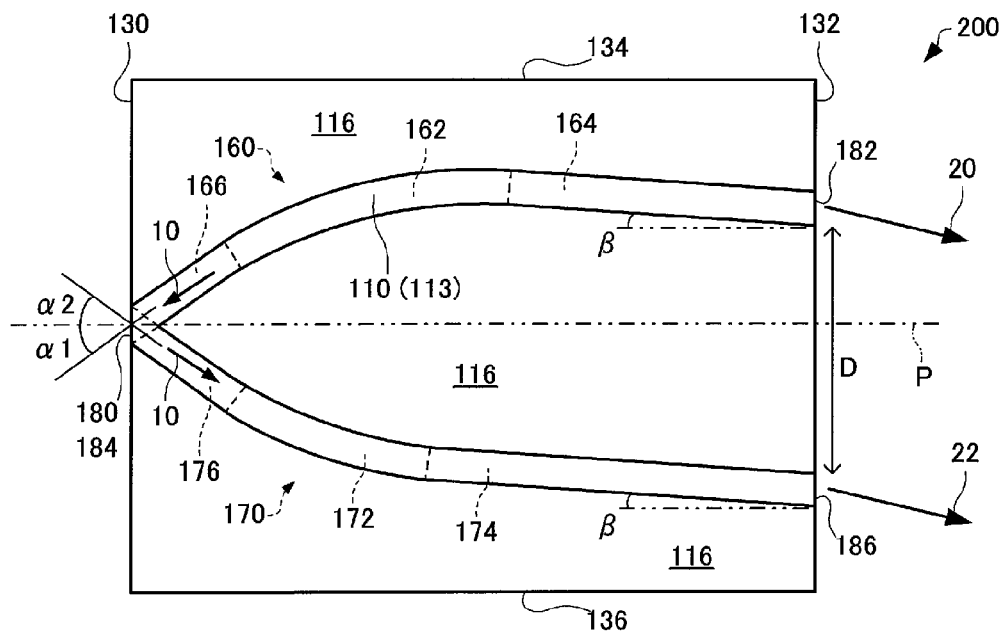
FIG. 5 is a plan view schematically showing a light emitting device according to a first modified example of the embodiment.

First, a light emitting device according to the first modified example of the embodiment will be explained with reference to the drawings. FIG. 5 is a plan view schematically showing a light emitting device 200 according to the first modified example of the embodiment. Note that, in FIG. 5, for convenience, illustration of the second electrode 114 is omitted.

In the example of the light emitting device 100, as shown in FIG. 1, the gain parts 162, 172 having curvature have been connected to the first surface 130. On the other hand, in the light emitting device 200, as shown in FIG. 5, linear gain parts 166, 176 are connected to the first surface 130.

That is, the first gain region 160 includes a fifth gain part 166 linearly provided from the first surface 130 to the first gain part 162 and having a belt-like shape with a predetermined width. That is, in the connection part of the fifth gain part 166 to the first surface 130, the first end surface 180 of the first gain region 160 is formed. The fifth gain part 166 is tilted toward one side (for example, the third surface 134 side) at the first angle $\alpha 1$ with respect to the perpendicular P. The longitudinal direction of the fifth gain part 166 is an extension direction of the fifth gain part 166 near the first surface 130, and, for example, may be a direction of a boundary line of the fifth gain part 166 (and the part except the first gain region 160). The fifth gain part 166 is smoothly connected to the arc-shaped first gain part 162. For example, the fifth gain part 166 is provided in parallel to a tangential direction of the first gain part 162 at a point on a boundary between the gain parts 162, 166.

The second gain region 170 includes a sixth gain part 176 linearly provided from the first surface 130 to the second gain part 172 and having a belt-like shape with a predetermined width. That is, in the connection part of the sixth gain part 176 to the first surface 130, the third end surface 184 of the second gain region 170 is formed. The sixth gain part 176 is tilted toward the other side (for example, the fourth surface 136 side) at the second angle $\alpha 2$ with respect to the perpendicular P. The longitudinal direction of the sixth gain part 176 is an extension direction of the sixth gain part 176 near the first surface 130, and, for example, may be a direction of a boundary line of the sixth gain part 176 (and the part except the second gain region 170). The sixth gain part 176 is smoothly connected to the arc-shaped second gain part 172. For example, the sixth gain part 176 is provided in parallel to a tangential direction of the second gain part 172 at a point on a boundary between the gain parts 172, 176. The gain parts 166, 176 may be provided symmetrically with respect to the perpendicular P.

According to the light emitting device 200, the linear gain parts 166, 176 form the end surfaces 180, 184 provided on the first surface 130 as described above. Accordingly, in the light emitting device 200, compared to the example of the light emitting device 100, the lights generated in the first gain region 160 and reflected on the first surface (end surfaces 180, 184) may be allowed to enter the second gain region 170 more reliably. Similarly, the lights generated in the second gain region 170 and reflected on the first surface 130 (end surfaces 180, 184) may be allowed to enter the first gain region 160 more reliably.

3.2. Light Emitting Device according to Second Modified Example

Figure 6:
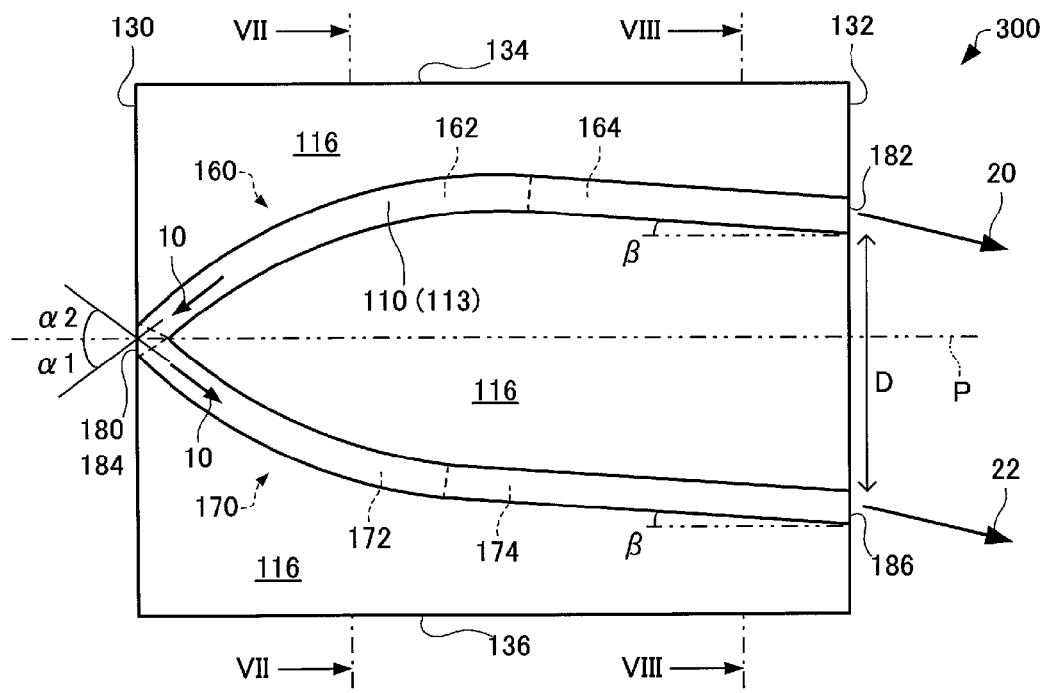
FIG. 6 is a plan view schematically showing a light emitting device according to a second modified example of the embodiment.
Figure 7:
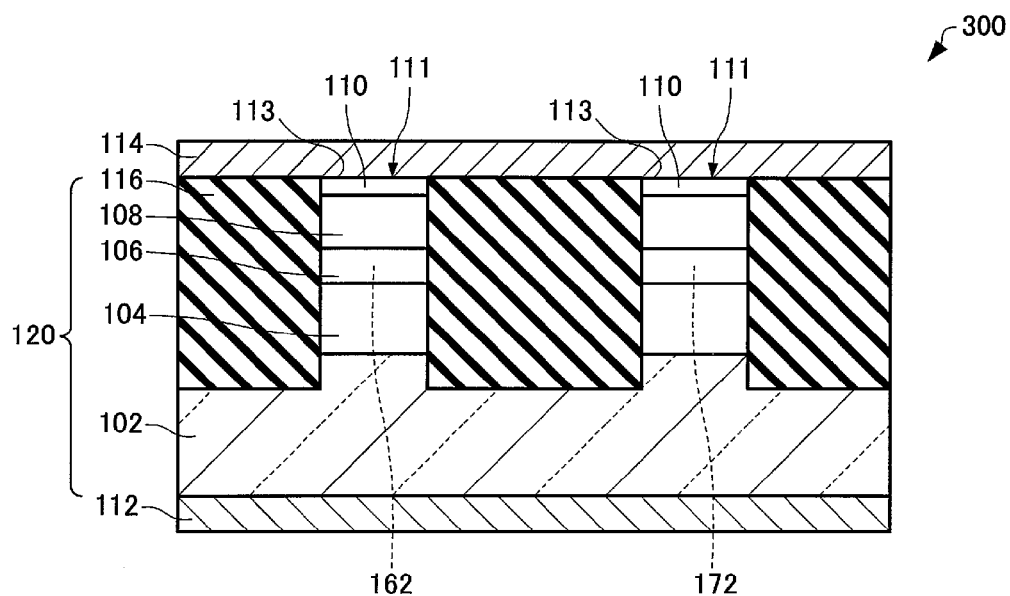
FIG. 7 is a sectional view schematically showing the light emitting device according to the second modified example of the embodiment.
Figure 8:
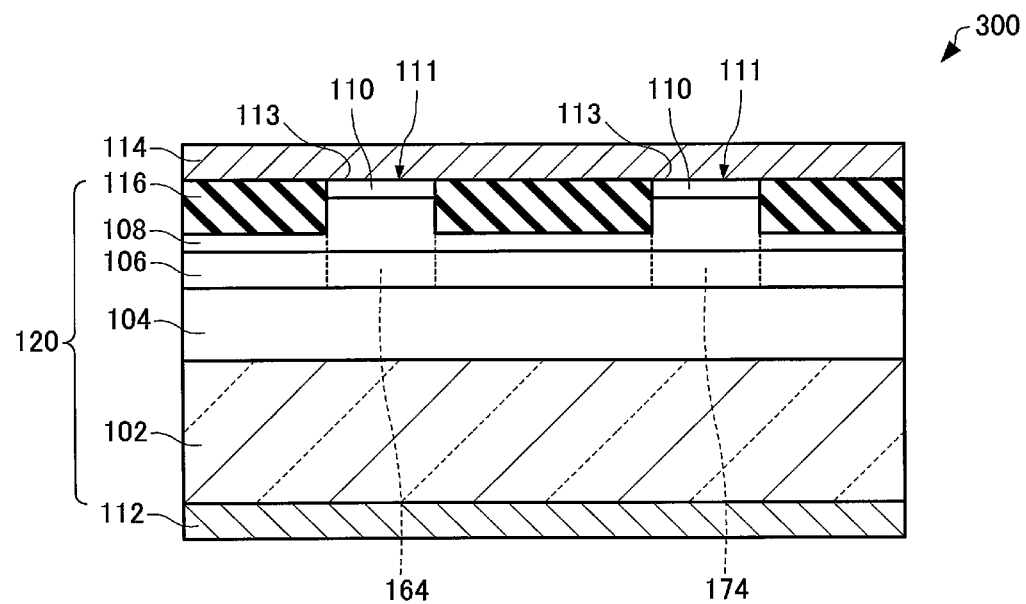
FIG. 8 is a sectional view schematically showing the light emitting device according to the second modified example of the embodiment.

Next, a light emitting device according to the second modified example of the embodiment will be explained with reference to the drawings. FIG. 6 is a plan view schematically showing a light emitting device 300 according to the second modified example of the embodiment. FIG. 7 is a sectional view schematically showing the light emitting device 300 according to the second modified example of the embodiment along VII-VII line of FIG. 6. FIG. 8 is a sectional view schematically showing the light emitting device 300 according to the second modified example of the embodiment along VIII-VIII line of FIG. 6. Note that, in FIG. 6, for convenience, illustration of the second electrode 114 will be omitted.

In the example of the light emitting device 100, as shown in FIG. 2, the columnar part 111 has been composed of the contact layer 110 and the part of the second cladding layer 108. On the other hand, in the light emitting device 300, as shown in FIG. 7, the columnar part 111 forming the planar shapes of the gain parts 162, 172 is composed of the contact layer 110, the second cladding layer 108, the active layer 106, the first cladding layer 104, and part of the substrate 102.

Note that, though not illustrated, the columnar part 111 forming the planar shapes of the gain parts 162, 172 may be composed of the contact layer 110, the second cladding layer 108, the active layer 106, and the first cladding layer 104, for example.

As the insulating layer 116, as described above, a dielectric layer such as an SiN layer, an $SiO_2$ layer, an SiON layer, or an $Al_2O_3$ layer, or a thermoset or an ultraviolet curable resin layer such as a polyimide layer may be used. Further, the insulating layer 116 may be formed by stacking the layers. Note that, given that the predetermined difference is provided between the effective refractive index of the gain parts 162, 172 and the effective refractive index of the parts except the gain regions 160, 170, it is desirable that an insulating layer having a larger refractive index difference from the columnar part 111 is used for the insulating layer 116. For example, the insulating layer 116 may be formed by, first, depositing a dielectric insulating layer using a CVD method or a sputtering method, and then, forming a polyimide layer using a coating method. Thereby, compared to the case where the insulating layer 116 is formed by depositing a dielectric insulating layer thicker, the insulating layer 116 may be formed easier (in a shorter time).

According to the light emitting device 300, compared to the light emitting device 100, the difference between the effective refractive index of the gain parts 162, 172 and the effective refractive index of the parts except the gain regions 160, 170 may be made larger (may be set to a desired value), and the lights within the gain parts 162, 172 may be guided more efficiently.

Note that it is desirable that the columnar part 111 forming the planar shapes of the linear gain parts 164, 174 is formed by the contact layer 110 and part of the second cladding layer 108 as shown in FIG. 8. When the columnar part 111 forming the planar shapes of the gain parts 164, 174 is formed by the contact layer 110, the second cladding layer 108, the active layer 106, the first cladding layer 104, and part of the substrate 102 as shown in FIG. 7, a higher-order traverse mode (a mode having a larger wave number in a direction across the gain regions, i.e., a direction perpendicular to the propagation direction in the horizontal plane) may propagate and the radiation pattern may be deteriorated.

Further, the above described materials may not be used for the insulating layer 116. In this case, surrounding air may make the difference between the effective refractive index of the gain parts 162, 172 and the effective refractive index of the parts except the gain regions 160, 170 larger (the refractive index of the air is about 1.0 and the refractive index of SiN is about 2.1).

Note that, as shown in FIG. 5, in the form further having the linear fifth gain part 166 and the sixth gain part 176, it is desirable that the columnar part 111 forming the planar shapes of the gain parts 166, 176 is formed by the contact layer 110 and part of the second cladding layer 108 like that for the gain parts 164, 174.

3.3. Light Emitting Device according to Third Modified Example

Figure 9:
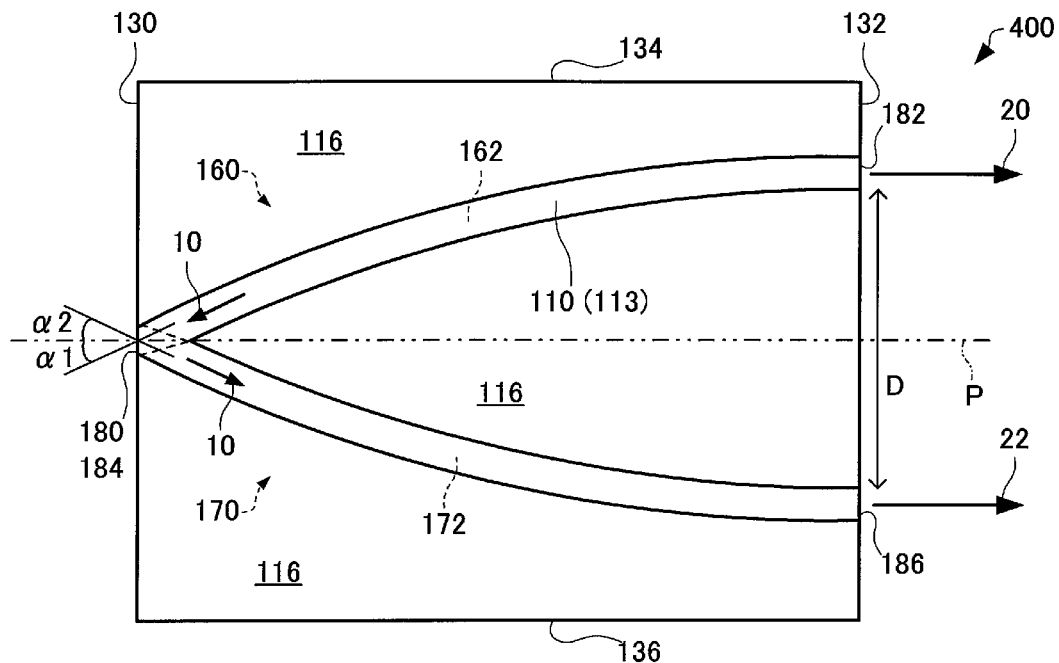
FIG. 9 is a plan view schematically showing a light emitting device according to a third modified example of the embodiment.

Next, a light emitting device according to the third modified example of the embodiment will be explained with reference to the drawings. FIG. 9 is a plan view schematically showing a light emitting device 400 according to the third modified example of the embodiment. Note that, in FIG. 9, for convenience, illustration of the second electrode 114 is omitted.

In the example of the light emitting device 100, as shown in FIG. 1, the first gain region 160 has had the linear third gain part 164 and the third gain part 164 has been connected to the second surface 132. Further, the second gain region 170 has had the linear fourth gain part 174 and the fourth gain part 174 has been connected to the second surface 132.

On the other hand, the light emitting device 400 does not have the linear gain parts 164, 174 as shown in FIG. 9. That is, the first gain part 162 having curvature is provided from the first surface 130 to the second surface 132. Similarly, the second gain part 172 having curvature is provided from the first surface 130 to the second surface 132. The connection part of the first gain part 162 to the second surface 132 forms the second end surface 182 of the first gain region 160. The connection part of the second gain part 172 to the second surface 132 forms the second end surface 186 of the second gain region 170.

The curvature of the first gain part 162 and the curvature of the second gain part 172 may be the same. The first gain part 162 and the second gain part 172 may be connected to the second surface 132 orthogonally to the perpendicular line P, i.e., α1 and α2 may be 90°.

According to the light emitting device 400, there is no linear gain part, and thus, downsizing may be realized by the amount.

3.4. Light Emitting Device according to Fourth Modified Example

Figure 10:
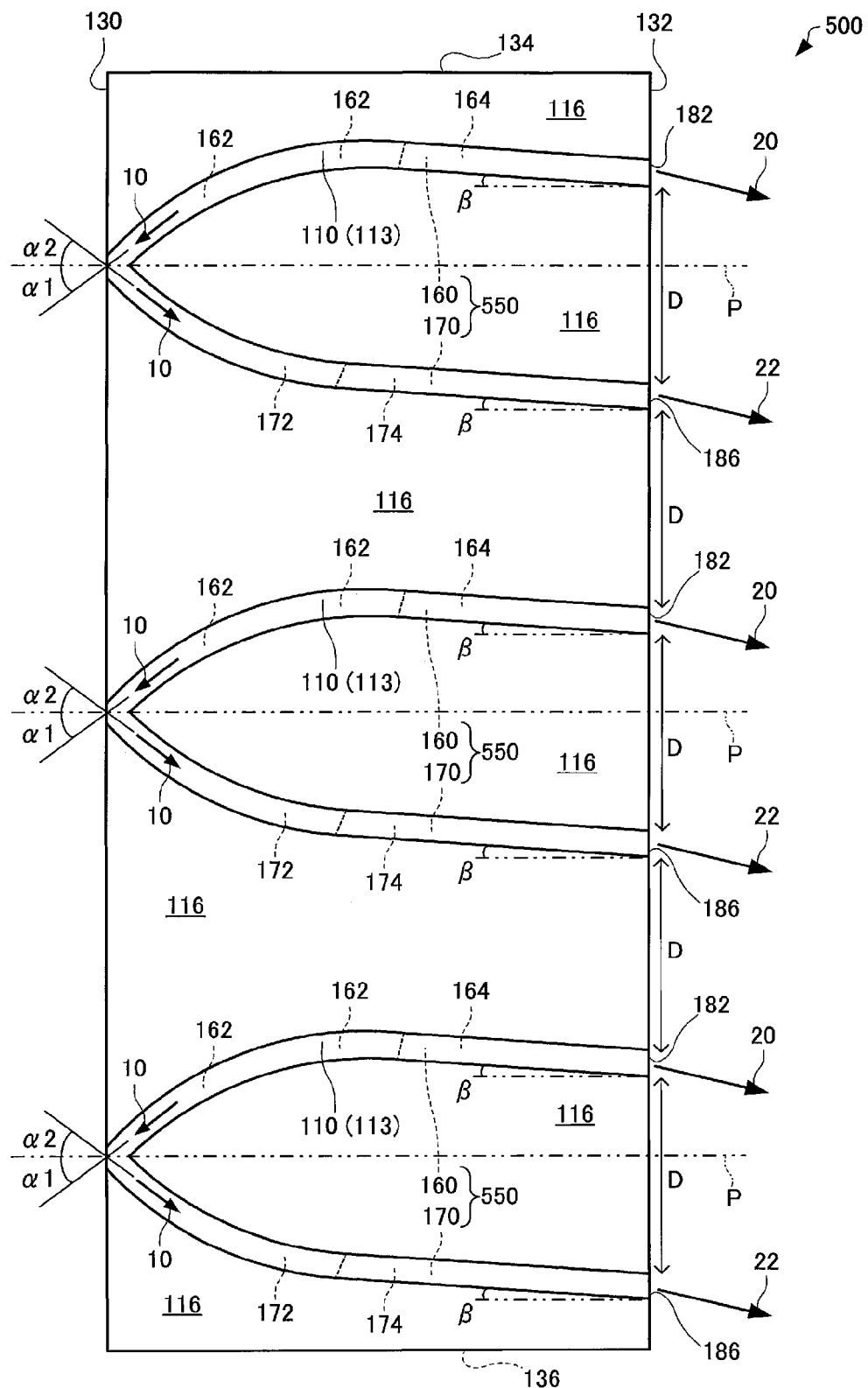
FIG. 10 is a plan view schematically showing a light emitting device according to a fourth modified example of the embodiment.

Next, a light emitting device according to the fourth modified example of the embodiment will be explained with reference to the drawings. FIG. 10 is a plan view schematically showing a light emitting device 500 according to the fourth modified example of the embodiment. Note that, in FIG. 10, for convenience, illustration of the second electrode 114 is omitted.

In the example of the light emitting device 100, as shown in FIG. 1, one first gain region 160 and one second gain region 170 have been provided. On the other hand, in the light emitting device 500, as shown in FIG. 10, plural first gain regions 160 and plural second gain regions 170 are respectively provided.

That is, the first gain region 160 and the second gain region 170 may form a pair of gain regions 550, and, in the light emitting device 500, plural pairs of gain regions 550 are provided. In the illustrated example, three pairs of gain regions 550 are provided, however, the number of pairs is not particularly limited.

The plural pairs of gain regions 550 are arranged in a direction orthogonal to the direction in which the perpendicular P extends. More specifically, they are arranged so that, in the adjacent pairs of gain regions 550, the distance between the fourth end surface 186 of one pair of gain regions 550 and the second end surface 182 of the other pair of gain regions 550 may be D (the distance between the light output parts). Thereby, the lights 20, 22 may be easily allowed to enter a lens array, which will be described later.

According to the light emitting device 500, higher output power may be realized compared to the example of the light emitting device 100.

4. Projector

Figure 11:
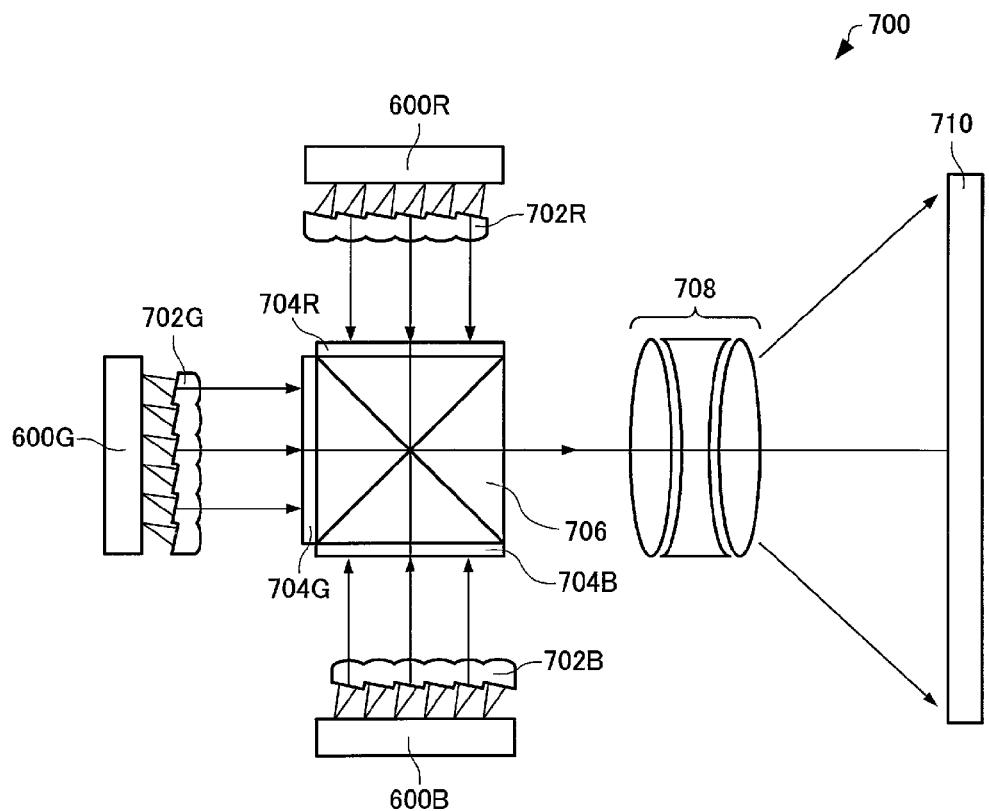
FIG. 11 schematically shows a projector according to the embodiment.
Figure 12:
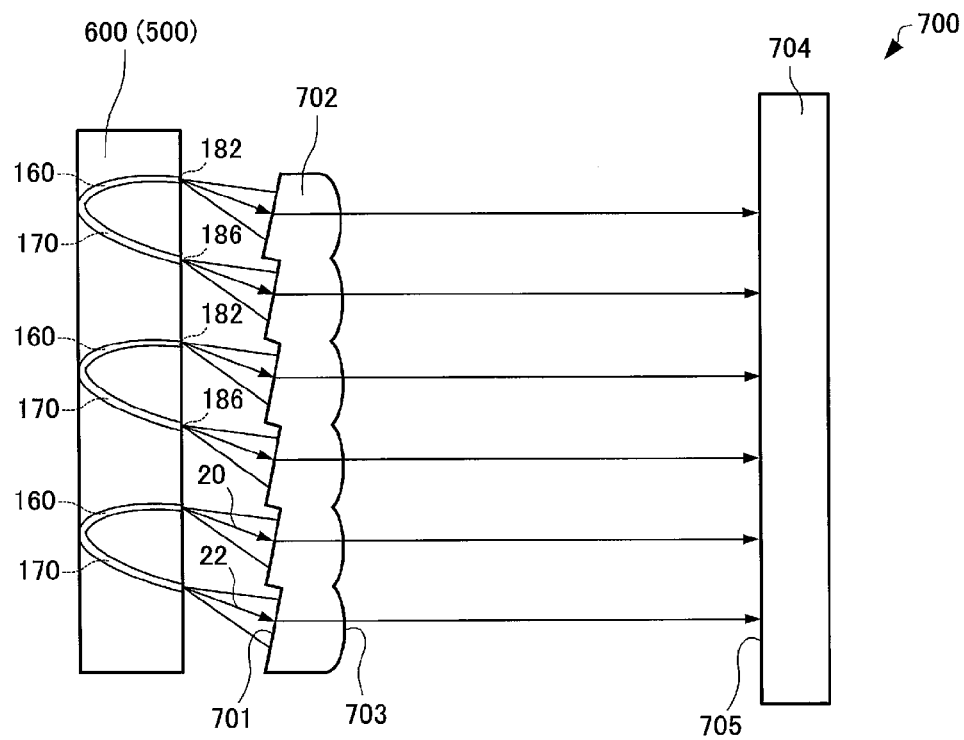
FIG. 12 schematically shows the projector according to the embodiment.

Next, a projector according to the embodiment will be explained with reference to the drawings. FIG. 11 schematically shows a projector 700 according to the embodiment. FIG. 12 schematically shows part of the projector 700 according to the embodiment. Note that, in FIG. 11, for convenience, a casing forming the projector 700 is omitted, and further, a light source 600 is simplified for illustration. Further, in FIG. 12, for convenience, the light source 600, a lens array 702, and a liquid crystal light valve 704 are illustrated, and further, the light source 600 is simplified for illustration.

The projector 700 includes a red light source 600R, a green light source 600G, and a blue light source 600B that output red light, green light, and blue light as shown in FIG. 11. The light sources 600R, 600G, 600B have the light emitting devices according to the invention. In the following example, the light sources 600R, 600G, 600B having the light emitting devices 500 as the light emitting devices according to the invention will be explained.

Figure 13:
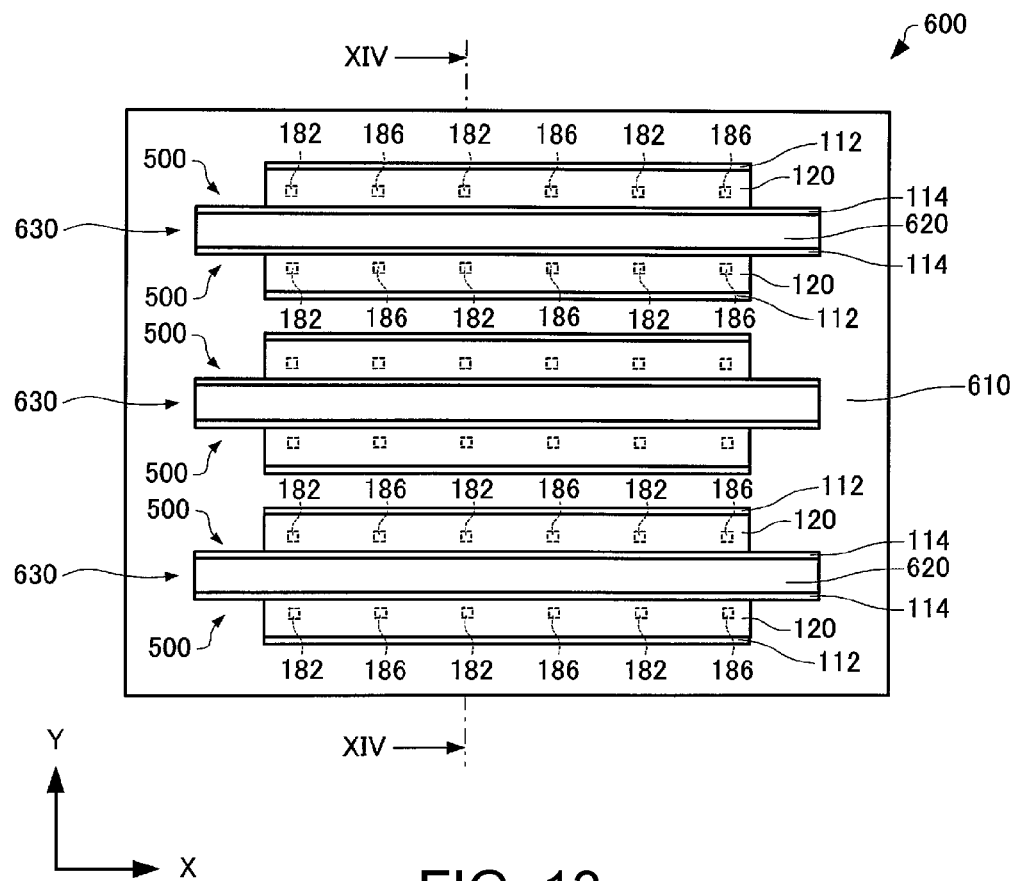
FIG. 13 schematically shows a light source of the projector according to the embodiment.
Figure 14:
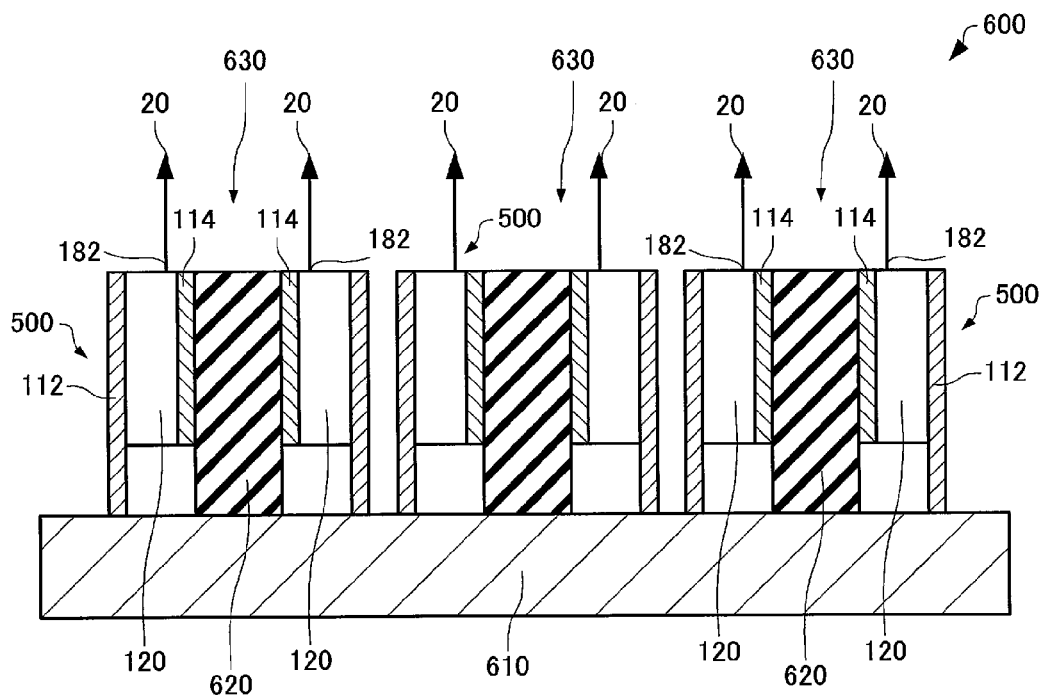
FIG. 14 is a sectional view schematically showing the light source of the projector according to the embodiment.

FIG. 13 schematically shows the light source 600 of the projector 700 according to the embodiment. FIG. 14 is a sectional view along XIV-XIV line of FIG. 13 schematically showing the light source 600 of the projector 700 according to the embodiment.

The light source 600 may have the light emitting devices 500, a base 610, and sub-mounts 620 as shown in FIGS. 13 and 14.

The two light emitting devices 500 and the sub-mount 620 may form a structure 630. Plural structures 630 are provided and arranged in the direction (Y-axis direction) orthogonal to the arrangement direction (X-axis direction) of the end surfaces 182, 186 which are the light output parts of the light emitting devices 500 as shown in FIG. 13. The structures 630 may be arranged so that the distance between the light output parts in the X-axis direction and the distance between the light output parts in the Y-axis direction may be equal. Thereby, the lights output from the light emitting devices 500 may be easily allowed to enter the lens array 702.

The two light emitting devices 500 forming the structure 630 are provided with the sub-mount 620 sandwiched in between. In the example shown in FIGS. 13 and 14, the two light emitting devices 500 are provided so that the second electrodes 114 may be opposed via the sub-mount 620. On part of the surface of the sub-mount 620 being contact with the second electrode 114, for example, wiring is formed. Thereby, voltages may be individually supplied to the respective plural second electrodes 114. As the material of the sub-mount 620, for example, aluminum nitride and aluminum oxide may be cited.

The base 610 supports the structures 630. In the example shown in FIG. 14, the base 610 is connected to the first electrodes 112 of the plural light emitting devices 500. Thereby, the base 610 may function as a common electrode of the plural first electrodes 112. As the material of the base 610, for example, copper and aluminum may be cited. Although not illustrated, the base 610 may be connected to a heat sink via a Peltier device.

Figure 15:
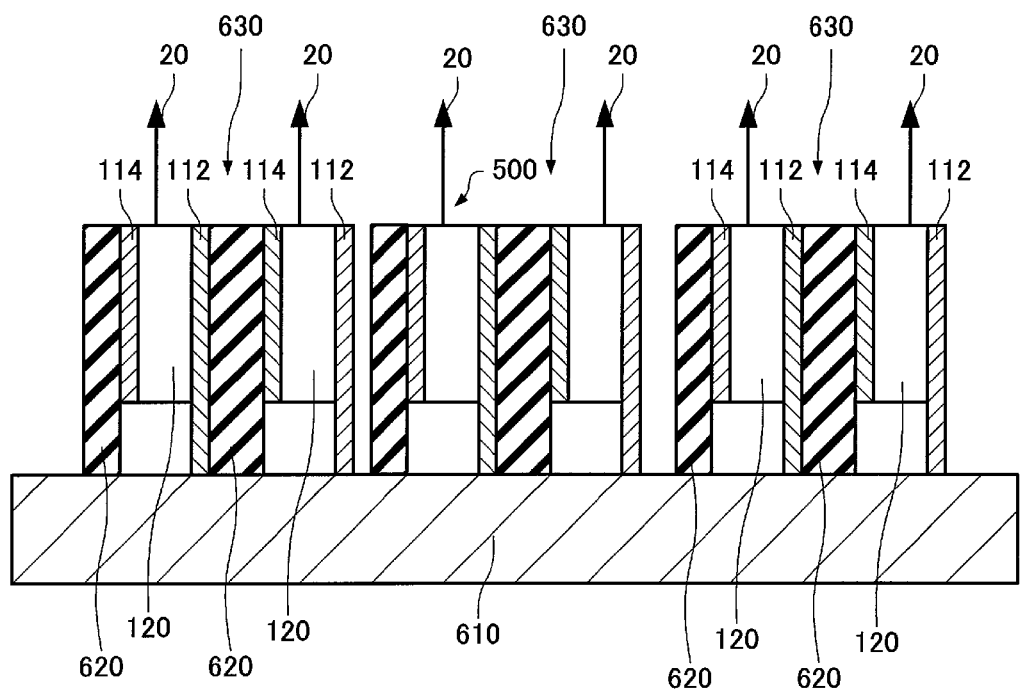
FIG. 15 is a sectional view schematically showing the light source of the projector according to the embodiment.
Figure 16:
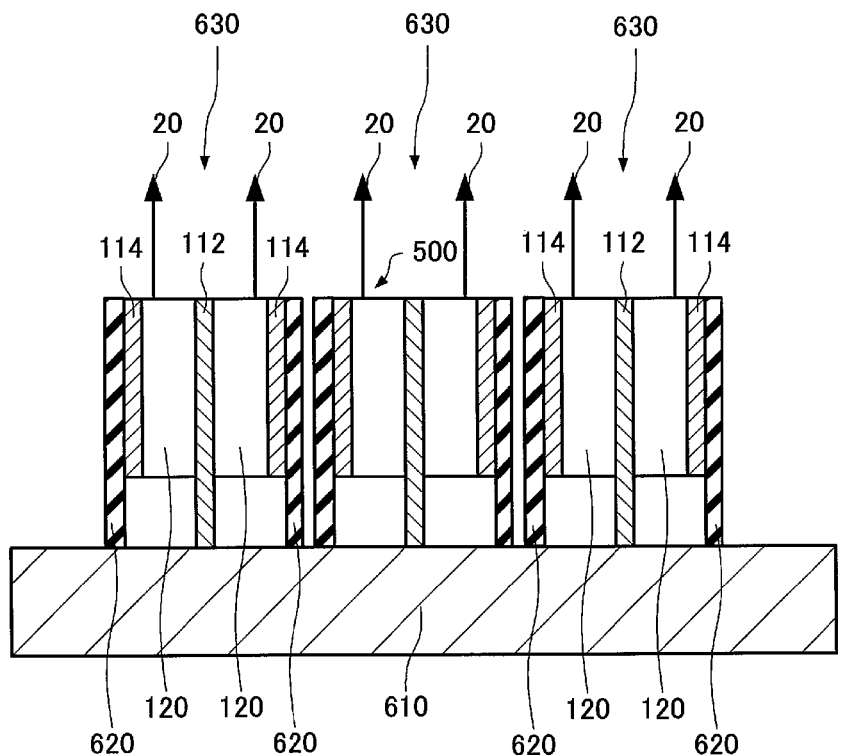
FIG. 16 is a sectional view schematically showing the light source of the projector according to the embodiment.

Note that the form of the structure 630 is not limited to the example shown in FIGS. 13 and 14. For example, as shown in FIG. 15, two light emitting devices 500 forming the structure 630 may be provided so that the first electrode 112 of one light emitting device 500 and the second electrode 114 of the other light emitting device 500 may be opposed via the sub-mount 620. Alternatively, as shown in FIG. 16, they may be provided so that the first electrodes 112 of the two light emitting devices 500 may be a common electrode.

As shown in FIG. 11, the projector 700 further includes lens arrays 702R, 702G, 702B and transmissive liquid crystal light valves (light modulation devices) 704R, 704G, 704B, and a projection lens (projection device) 708.

The lights output from the respective light sources 600R, 600G, 600B enter the respective lens arrays 702R, 702G, 702B. As shown in FIG. 12, the lens array 702 may have flat surfaces 701 that the lights 20, 22 output from the light output parts 182, 186 enter. Plural flat surfaces 701 are provided in correspondence with the plural light output parts 182, 186 and arranged at equal distances. Further, the normal lines of the flat surfaces 701 are tilted with respect to the optical axes of the lights 20, 22. By the flat surfaces 701, the optical axes of the lights 20, 22 may be made orthogonal to an irradiated surface 705 of the liquid crystal light valve 704. Especially, When the angles β formed by the second surface 132 and the first and the second gain region 160, 170 are not 0°, the lights 20, 22 output from the respective light output parts 182, 186 are tilted with respect to the perpendicular P of the second surface 132, and thus, it is desirable that the flat surfaces 701 are provided.

The lens array 702 may have convex curved surfaces 703 at the liquid crystal light valve 704 side. Plural convex curved surfaces 703 are provided in correspondence with the plural flat surfaces 701 and arranged at equal distances. The lights 20, 22 with their optical axes converted on the flat surfaces 701 are collected or travel at diffusion angles reduced by the convex curved surfaces 703, and may be superimposed (partially superimposed). Thereby, the liquid crystal light valve 704 may be irradiated with good uniformity.

As described above, the lens array 702 may control the optical axes of the lights 20, 22 output from the light source 600 and integrate them.

As shown in FIG. 11, the lights integrated by the respective lens arrays 702R, 702G, 702B enter the respective liquid crystal light valves 704R, 704G, 704B. The respective liquid crystal light valves 704R, 704G, 704B respectively modulate the incident lights in response to image information. Then, the projection lens 708 enlarges images formed by the liquid crystal light valves 704R, 704G, 704B and projects them on a screen (display surface) 710.

Further, the projector 700 may include a cross dichroic prism (color combining means) 706 that combines lights output from the liquid crystal light valves 704R, 704G, 704B and guides the light to the projection lens 708.

The three color lights modulated by the respective liquid crystal light valves 704R, 704G, 704B enter the cross dichroic prism 706. The prism is formed by bonding four right angle prisms, and a dielectric multilayer film that reflects red light and a dielectric multilayer film that reflects blue light are provided crosswise on its inner surfaces. By the dielectric multilayer films, the three color lights are combined and light representing a color image is formed. Then, the combined light is projected on the screen 710 by the projection lens 708 as a projection system, and the enlarged image is displayed thereon.

According to the projector 700, the light emitting devices 500 in which the radiation pattern is good (more symmetric) and the distances between the plural light emitting areas may be made to the desired values while downsizing is realized is provided. Accordingly, in the projector 700, alignment of the lens array 702 may be easy and the liquid crystal light valve 704 may be irradiated with good uniformity.

Note that, in the above described example, the transmissive liquid crystal light valves have been used as the light modulation devices, however, other light valves than liquid crystal or reflective light valves may be used. As the light valves, for example, reflective liquid crystal light valves and digital micromirror devices may be cited. Further, the configuration of the projection system may appropriately be changed depending on the type of the light valves employed.

Further, the light source 600 and the lens array 702 may be modularized in alignment with each other. Furthermore, the light source 600, the lens array 702, and the light valve 704 may be modularized in alignment with one another.

In addition, the light source 600 may also be applied to a light source device of a scanning type image display device (projector) having a means of scanning light for displaying an image in a desired size on a display surface.

The above described embodiments and modified examples are just examples, and the invention is not limited to those. For example, the respective embodiments and the respective modified examples may be appropriately combined.

The embodiments of the invention have been specifically explained as above, and a person skilled in the art could easily understand that many modifications can be made without substantively departing from the new matter and effects of the invention. Therefore, these modified examples are included in the range of the invention.

What is claimed is:

1. A light emitting device comprising:
   a first layer that generates light by injection current and forms a waveguide of the light;
   a second layer and a third layer that sandwich the first layer and suppress leakage of the light; and
   an electrode that injects the current into the first layer,
   wherein the waveguide of the light obtained by the electrode has a belt-like first region and a belt-like second region,
   the first region has a first part with curvature,
   the second region has a second part with curvature,
   the first region and the second region are connected in a reflection part provided on a side surface of the first layer, and
   a first light is output from the first region on an output surface,
   a second light is output from the second region on the output surface, and
   the first and second light are output in the same direction.

2. The light emitting device according to claim 1, wherein the reflection part has reflectance higher than reflectance on the output surface in a wavelength range of the light generated in the first layer.

3. The light emitting device according to claim 1, wherein the first region is connected to the reflection part and tilted in a first direction with respect to a perpendicular of the side surface on which the reflection part is provided as seen from a stacking direction of the first layer, and the second layer, and the second region is connected to the reflection part tilted in a second direction with respect to the perpendicular of the side surface on which the reflection part is provided as seen from the stacking direction of the first layer, and the second layer.

4. The light emitting device according to claim 3, wherein the first region is tilted at a first angle with respect to the perpendicular and connected to the reflection part, the second region is tilted at a second angle with respect to the perpendicular and connected to the reflection part, and the first angle and the second angle are equal to or more than a critical angle and the same.

5. The light emitting device according to claim 1, wherein the first region and the second region are connected to the output surface in the same direction as seen from a stacking direction of the first layer, and the second layer.

6. The light emitting device according to claim 5, wherein the first region and the second region are connected to the output surface and tilted with respect to a perpendicular of the output surface as seen from the stacking direction of the first layer, and the second layer.

7. The light emitting device according to claim 5, wherein the first region and the second region are connected to the output surface and are in parallel to a perpendicular of the output surface as seen from the stacking direction of the first layer, and the second layer.

8. The light emitting device according to claim 1, wherein the first region has a third part linearly provided from the first part to the output surface, and the second region has a fourth part linearly provided from the second part to the output surface.

9. The light emitting device according to claim 1, wherein the first region has a fifth part linearly provided from the reflection part to the first part, and the second region has a sixth part linearly provided from the reflection part to the second part.

10. The light emitting device according to claim 1, wherein the first part is connected to the reflection part and the output surface, and the second part is connected to the reflection part and the output surface.

11. The light emitting device according to claim 1, wherein the first part and the second part have arc shapes as seen from a stacking direction of the first layer, and the second layer.

12. The light emitting device according to claim 1, wherein the side surface on which the reflection part is provided is a cleavage surface.

13. A light emitting device comprising a multilayered structure having a first layer, and a second layer and a third layer that sandwich the first layer, the first layer having a first gain region and a second gain region that generate and guide lights, the second layer and the third layer being layers that suppress leakage of the lights generated in the first gain region and the second gain region, the first layer having a first side surface and a second side surface in a wavelength range of the lights generated in the first gain region and the second gain region, reflectance of the first side surface being higher than reflectance of the second side surface, the first gain region and the second region being provided from the first side surface to the second side surface, the first gain region being connected to the first side surface and tilted in a first direction with respect to a perpendicular of the first side surface as seen from a stacking direction of the multilayered structure, the second gain region being connected to the first side surface and tilted in a second direction with respect to the perpendicular as seen from the stacking direction of the multilayered structure, the first gain region and the second gain region being connected to the second side surface in the same direction as seen from the stacking direction of the multilayered structure, an end surface at the first side surface side of the first gain region and an end surface at the first side surface side of the second gain region overlapping on the first side surface, the first gain region having a first gain part with first curvature as seen from the stacking direction of the multilayered structure, and the second gain region having a second gain part with second curvature as seen from the stacking direction of the multilayered structure.

14. A projector comprising:
the light emitting device according to claim 1;
a microlens that integrates light output from the light emitting device;
a light modulation device that modulates the light integrated by the microlens in response to image information; and
a projection device that projects an image formed by the light modulation device.

15. A projector comprising:
the light emitting device according to claim 2;
a microlens that integrates light output from the light emitting device;
a light modulation device that modulates the light integrated by the microlens in response to image information; and
a projection device that projects an image formed by the light modulation device.

16. A projector comprising:
the light emitting device according to claim 3;
a microlens that integrates light output from the light emitting device;
a light modulation device that modulates the light integrated by the microlens in response to image information; and
a projection device that projects an image formed by the light modulation device.

17. A projector comprising:
the light emitting device according to claim 4;
a microlens that integrates light output from the light emitting device;
a light modulation device that modulates the light integrated by the microlens in response to image information; and
a projection device that projects an image formed by the light modulation device.

18. A projector comprising:
the light emitting device according to claim 5;
a microlens that integrates light output from the light emitting device;
a light modulation device that modulates the light integrated by the microlens in response to image information; and
a projection device that projects an image formed by the light modulation device.

19. A projector comprising:
the light emitting device according to claim 6;
a microlens that integrates light output from the light emitting device;
a light modulation device that modulates the light integrated by the microlens in response to image information; and
a projection device that projects an image formed by the light modulation device.

20. A projector comprising:
the light emitting device according to claim 13;
a microlens that integrates light output from the light emitting device;
a light modulation device that modulates the light integrated by the microlens in response to image information; and
a projection device that projects an image formed by the light modulation device.

\* \* \* \* \*